(12) United States Patent
Kim et al.

(10) Patent No.: US 8,357,992 B2
(45) Date of Patent: Jan. 22, 2013

(54) NON-VOLATILE MEMORY DEVICE AND METHOD OF MANUFACTURING THE SAME

(75) Inventors: Ho-jung Kim, Suwon-si (KR);
In-kyeong Yoo, Yongin-si (KR);
Chang-jung Kim, Yongin-si (KR);
Ki-ha Hong, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 322 days.

(21) Appl. No.: 12/659,516

(22) Filed: Mar. 11, 2010

(65) Prior Publication Data
US 2011/0085368 A1    Apr. 14, 2011

(30) Foreign Application Priority Data
Oct. 14, 2009    (KR) .................. 10-2009-0097737

(51) Int. Cl.
*H01L 23/52*    (2006.01)
*H01L 29/00*    (2006.01)
(52) U.S. Cl. .. 257/529; 257/536; 257/537; 257/E27.024
(58) Field of Classification Search .................. 257/390, 257/529, 536, 537, E27.024
See application file for complete search history.

(56) References Cited

U.S. PATENT DOCUMENTS

| | | | |
|---|---|---|---|
| 7,149,107 B2 | 12/2006 | Rinerson et al. | |
| 7,227,767 B2 | 6/2007 | Rinerson et al. | |
| 7,463,546 B2 | 12/2008 | Fasoli et al. | |
| 7,486,587 B2 | 2/2009 | Scheuerlein et al. | |
| 2008/0265235 A1* | 10/2008 | Kamigaichi et al. | 257/2 |
| 2011/0310662 A1* | 12/2011 | Scheuerlein | 365/163 |

FOREIGN PATENT DOCUMENTS

| | | |
|---|---|---|
| JP | 2008-160004 | 7/2008 |
| JP | 2009-009657 | 1/2009 |
| JP | 2009-037703 | 2/2009 |
| JP | 2009-117006 | 5/2009 |
| KR | 10-0827697 | 4/2008 |
| KR | 10-2008-0096432 | 10/2008 |

OTHER PUBLICATIONS

Abstract of US 2008-0265235 published on Oct. 30, 2008.
Abstract of US 7,570,511 issued on Aug. 4, 2009.

* cited by examiner

*Primary Examiner* — Ngan Ngo
(74) *Attorney, Agent, or Firm* — Harness, Dickey & Pierce, P.L.C.

(57) ABSTRACT

The non-volatile memory device may include a substrate, a plurality of first signal lines on the substrate in a vertical direction, a plurality of memory cells having ends connected to the plurality of first signal lines, a plurality of second signal lines perpendicular to the plurality of first signal lines on the substrate and each connected to other ends of the plurality of memory cells, and a plurality of selection elements on the substrate and connected to at least two of the plurality of first signal lines.

12 Claims, 13 Drawing Sheets

NON-VOLATILE MEMORY DEVICE AND METHOD OF MANUFACTURING THE SAME

CROSS-REFERENCE TO RELATED APPLICATION

This application claims priority under U.S.C. §119 to Korean Patent Application No. 10-2009-0097737, filed on Oct. 14, 2009, in the Korean Intellectual Property Office (KIPO), the entire contents of which are incorporated herein by reference.

BACKGROUND

1. Field

Example embodiments relate to non-volatile memory devices and methods of manufacturing the same.

2. Description of the Related Art

Because higher capacity and lower power consumption are required in memory devices, next generation memory devices which are non-volatile and do not require refreshing are being studied. These next generation memory devices require the high-integration of dynamic random access memory (DRAM), the non-volatility of flash memory, and the high-speed of static RAM (SRAM), for example, phase change RAM (PRAM), nano-floating gate memory (NFGM), Polymer RAM (PoRAM), Magnetic RAM (MRAM), Ferroelectric RAM (FeRAM) and Resistive RAM (RRAM).

In RRAM, when higher voltage is applied to an insulator, a path through which current flows may be generated, and thus, resistance may be reduced. When the path is generated once, the path may be removed by applying a sufficient voltage or may be regenerated.

SUMMARY

Provided are highly-integrated and high-capacity non-volatile memory devices including memory cells, wherein when the memory cells include signal lines perpendicular to a substrate, the signal lines may be shared so as to reduce the number of selection elements which perform selection operations for the signal lines, and methods of manufacturing the non-volatile memory devices. Additional aspects will be set forth in part in the description which follows and, in part, will be apparent from the description, or may be learned by practice of example embodiments.

According to example embodiments, a non-volatile memory device may include a substrate, a plurality of first signal lines on the substrate in a vertical direction, a plurality of memory cells having ends connected to the plurality of first signal lines, a plurality of second signal lines perpendicular to the plurality of first signal lines on the substrate and each connected to other ends of the plurality of memory cells, and a plurality of selection elements on the substrate and connected to at least two of the plurality of first signal lines.

The plurality of selection elements may be each connected to at least two of the plurality of first signal lines that are not adjacent to each other and perform selection operations for the at least two of the plurality of first signal lines. The plurality of second signal lines may be classified into a plurality of groups, and the plurality of second signal lines included in each of the plurality of groups are connected to each other. The plurality of second signal lines included in each of the plurality of groups may not be adjacent to each other.

The plurality of memory cells may be arranged in a line and one of the ends of the plurality of memory cells may be connected to one of the plurality of first signal lines. A pair of memory cells that are adjacent to each other from among the plurality of memory cells may share one of the plurality of first signal lines and the memory cells which are each included in a different pair and are adjacent to each other from among the plurality of memory cells may share one of the plurality of second signal lines.

The plurality of memory cells may each include a variable resistance body connected to one of the plurality of first signal lines; and a diode between one of the plurality of second signal lines and the variable resistance body.

According to example embodiments, a non-volatile memory device may include a plurality of memory units including a plurality of memory cells, a plurality of first signal lines each formed between a pair of memory units that are adjacent to each other from among the plurality of memory units, a plurality of second signal lines each formed between the memory units which are each included in a different pair and are adjacent to each other from among the plurality of memory units, and a plurality of selection elements each connected to at least two of the plurality of first signal lines.

According to example embodiments, a method of manufacturing a non-volatile memory device may include forming a plurality of selection elements on a substrate, forming a plurality of stack structures including a plurality of second signal lines and a plurality of insulating layers between the plurality of second signal lines, forming diode layers and variable resistance body layers sequentially on the sides of each of the plurality of stack structures, forming a plurality of first signal lines between the variable resistance body layers each formed on the sides of two stack structures from among the plurality of stack structures, and connecting the plurality of selection elements to at least two of the plurality of first signal lines.

Connecting the plurality of selection elements to the at least two of the plurality of first signal lines may further include connecting the plurality of first signal lines to the at least two of the plurality of first signal lines that are not adjacent to each other from among the plurality of first signal lines.

The method may further include classifying the plurality of second signal lines into a plurality of groups, and connecting the second signal lines included in each of the plurality of groups to each other. The second signal lines included in each of the plurality of groups may not be adjacent to each other. The method may further include forming memory cells from the diode layers and the variable resistance body layers between one of the plurality of first signal lines and one of the plurality of second signal lines.

According to example embodiments, a method of operating a non-volatile memory device may include providing a plurality of first signal lines, a plurality of memory cells having ends connected to the plurality of first signal lines, a plurality of second signal lines perpendicular to the plurality of first signal lines and each connected to other ends of the plurality of memory cells, and a plurality of selection elements and connected to at least two of the plurality of first signal lines, and applying a voltage to one first signal line of the plurality of first signal lines.

The voltage may be a write voltage, and the method may further include turning on one of the selection elements from among the plurality of selection elements to select the one first signal line of the plurality of first signal lines connected to one memory cell of the plurality of memory cells, and turning off the plurality of selection elements connected to the other first signal lines adjacent to the one first signal line, applying a ground voltage to a second signal line of the plurality of second signal lines connected to the one memory cell of the plurality of memory cells, and applying an inhibit voltage to the other second signal lines adjacent to the plurality of second signal lines connected to the one memory cell from among the plurality of second signal lines. The voltage may be a read voltage, the read voltage being less than a write voltage.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1A:
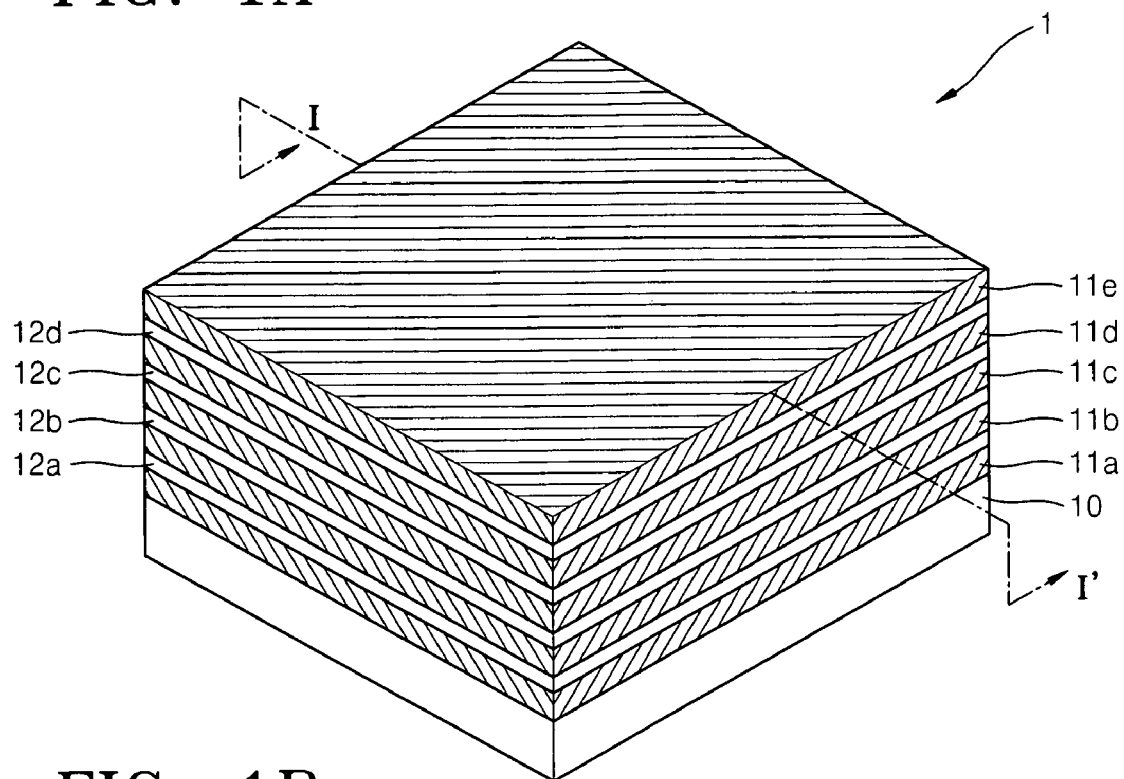
FIGS. 1A through 1F are perspective views schematically illustrating a method of manufacturing a non-volatile memory device, according to example embodiments.

Hereinafter, example embodiments will be described more fully with reference to the accompanying drawings, in which example embodiments are shown. Example embodiments may, however, be embodied in many different forms and should not be construed as being limited to example embodiments set forth herein; rather, these example embodiments are provided so that this disclosure will be thorough and complete, and will fully convey the concept of example embodiments to those of ordinary skill in the art. In the drawings, elements may be exaggerated for convenience of description.

It will be understood that when an element, such as a layer, a region, or a substrate, is referred to as being "on," "connected to" or "coupled to" another element, it may be directly on, connected or coupled to the other element or Intervening elements may be present. In contrast, when an element is referred to as being "directly on," "directly connected to" or "directly coupled to" another element or layer, there are no intervening elements or layers present. Like reference numerals refer to like elements throughout.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

FIGS. 1A through 1F are perspective views schematically illustrating a method of manufacturing a non-volatile memory device 1, according to example embodiments, and FIGS. 2A through 2E are cross-sectional views schematically illustrating the method of manufacturing the non-volatile memory device 1 of FIGS. 1A through 1F.

FIGS. 2A through 2E are cross-sectional views taken along lines I-I' of FIGS. 1A through 1F, respectively. Hereinafter, the method of manufacturing the non-volatile memory device 1, according to example embodiments, will be described with reference to FIGS. 1A through 1F and FIGS. 2A through 2E.

Figure 2A:
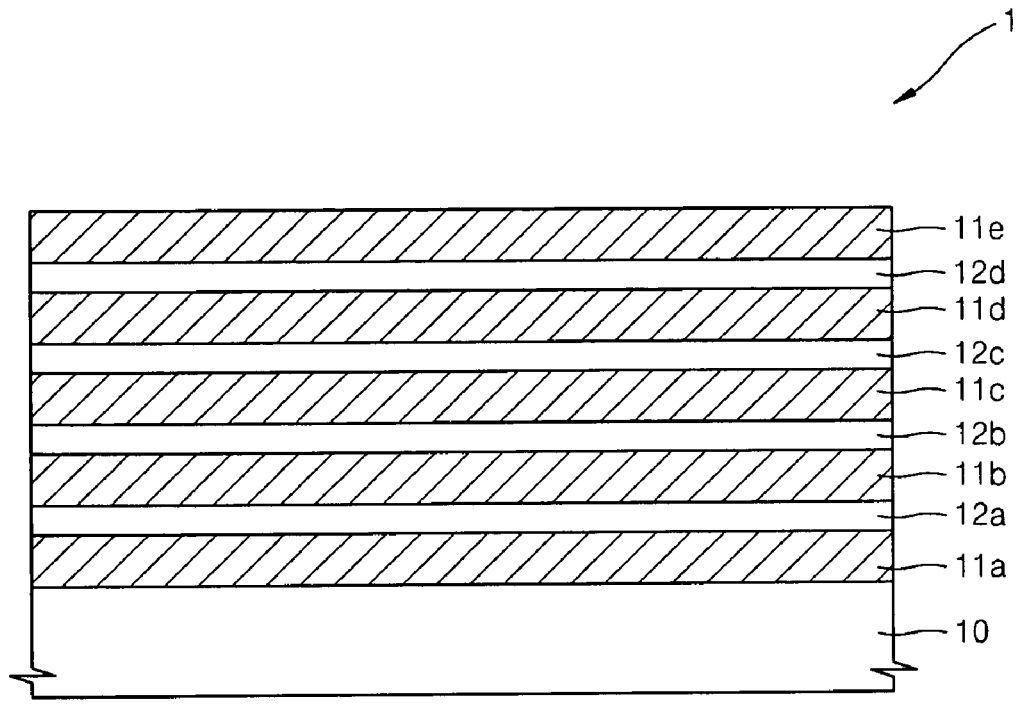
FIGS. 2A through 2E are cross-sectional views schematically illustrating the method of manufacturing the non-volatile memory device of FIGS. 1A through 1F.

Referring to FIGS. 1A and 2A, a plurality of selection elements (not illustrated) may be formed on a substrate 10. The substrate 10 may be a semiconductor substrate, e.g., a silicon substrate, silicon-on-insulator substrate, silicon-on-sapphire substrate, germanium substrate, or gallium arsenide substrate. Also, the selection elements may be realized as transistors. A method of forming the transistors is obvious to one of ordinary skill in the art to which example embodiments pertain and thus detailed description thereof is omitted.

A stack structure including a plurality of insulating layers 11a, 11b, 11c, 11d, and 11e and a plurality of first electrode layers 12a, 12b, 12c, and 12d interposed between the plurality of insulating layers 11a, 11b, 11c, 11d, and 11e may be formed on the substrate 10 on which the plurality of selection elements (not shown) are formed. Accordingly, the plurality of first electrode layers 12a, 12b, 12c, and 12d may be each insulated from each other by the plurality of insulating layers 11a, 11b, 11c, 11d, and 11e. The plurality of insulating layers 11a, 11b, 11c, 11d, and 11e and the plurality of first electrode layers 12a, 12b, 12c, and 12d may be sequentially formed on the substrate 10 by using atomic layer deposition (ALD) or chemical vapor deposition (CVD).

The plurality of insulating layers 11a, 11b, 11c, 11d, and 11e may be a dielectric, e.g., a silicon oxide ($SiO_2$), silicon oxynitride (SiON), or silicon nitride (SiN), or a high-k material, e.g., hafnium oxide ($HfO_2$), hafnium silicon oxide (HfSiO), hafnium oxynitride (HfON), hafnium silicon oxynitride (HfSiON), hafnium aluminum oxide (HfAlO), hafnium lanthanum oxide (HfLaO), or lanthanum oxide ($La_2O_3$). Also, the plurality of first electrode layers 12a, 12b, 12c, and 12d may be one selected from the group consisting of polysilicon, a metal, metal silicide, and mixtures thereof, wherein the metal may include at least one selected from the group consisting of cobalt (Co), titanium (Ti), molybdenum (Mo), tantalum (Ta), zirconium (Zr), tungsten (W), and nickel (Ni).

Figure 1B:
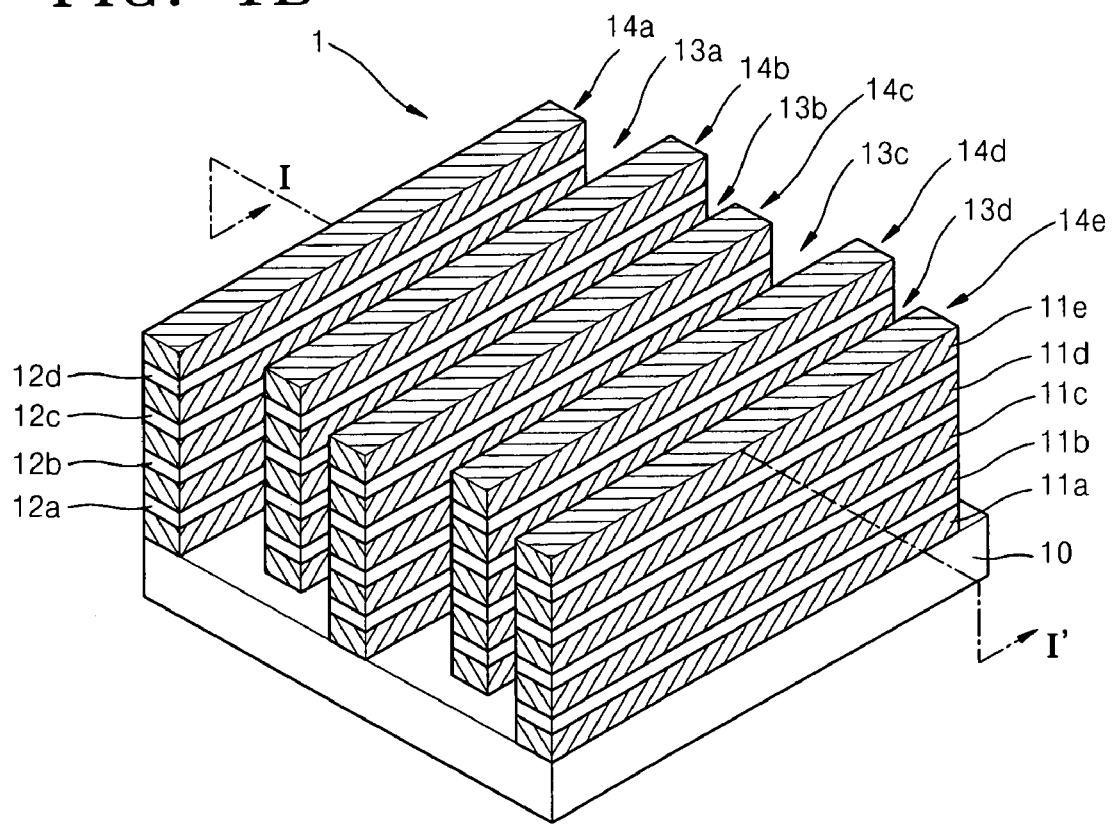
Figure 2B:
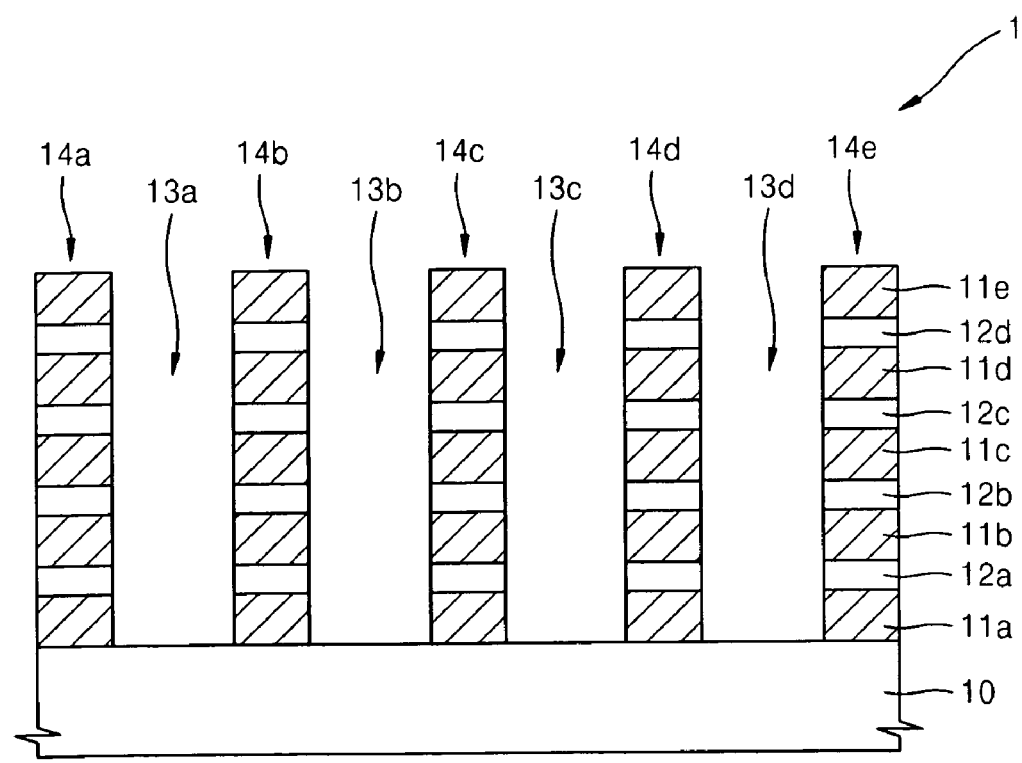

Referring to FIGS. 1B and 2B, a plurality of trenches 13a, 13b, 13c, and 13d may be formed in the stack structure, thereby exposing the substrate 10, and thus, a plurality of separate stack structures 14a, 14b, 14c, 14d, and 14e may be formed separate from each other. In example embodiments, the first electrode layers 12a, 12b, 12c, and 12d each included in the separate stack structures 14a, 14b, 14c, 14d, and 14e may be bit lines.

For example, a lithography process may be performed on the substrate 10 on which the stack structure is formed so as to form the plurality of trenches 13a, 13b, 13c, and 13d. In example embodiments, a predetermined or given area of the stack structure may be etched until the substrate 10 is exposed, thereby forming the plurality of trenches 13a, 13b, 13c, and 13d. Also, in example embodiments, a predetermined or given area of the stack structure may be etched to form the plurality of trenches 13a, 13b, 13c, and 13d until the first insulating layer 11a is exposed.

The plurality of separate stack structures 14a, 14b, 14c, 14d, and 14e may be each located differently on the substrate 10. For example, the separate stack structure 14b interposed between the trench 13a and the trench 13b, and the separate stack structure 14d interposed between the trench 13c and the trench 13d may be offset from the separate stack structures 14a, 14c, and 14e by a predetermined or given interval (that is, more inside from the edge of the substrate 10 by a predetermined or given interval). In other words, the separate stack structures 14a, 14c, and 14e may be formed in the front of the stack structures 14b and 14d by a predetermined or given interval.

The separate stack structures 14a, 14b, 14c, 14d, and 14e may be located differently on the substrate 10 so as to easily group the plurality of first electrode layers 12a, 12b, 12c, and 12d into a predetermined or given number by connecting the first electrode layers 12a, 12b, 12c, and 12d included in each different stack structure.

For example, the first electrode layers 12a, 12b, 12c, and 12d that are arranged to correspond to each other from among the first electrode layers 12a, 12b, 12c, and 12d included in the separate stack structures 14a, 14c, and 14e may be connected to each other. For example, the first electrode layers 12a disposed at the bottom of each of the separate stack structures 14a, 14c, and 14e may be connected to each other. Also, the first electrode layers 12a, 12b, 12c, and 12d that are arranged to correspond to each other from among the first electrode layers 12a, 12b, 12c, and 12d included in the separate stack structures 14b and 14d may be connected to each other.

For example, the first electrode layers 12a disposed at the bottom of each of the separate stack structures 14b and 14d may be connected to each other. Accordingly, when the first electrode layers 12a, 12b, 12c, and 12d are grouped by a predetermined or given number, a decoder for decoding address signals for the first electrode layers 12a, 12b, 12c, and 12d may be easily realized so that complexity may be reduced and an area for realizing the decoder may be decreased, thereby reducing a size of the non-volatile memory device 1.

Figure 1C:
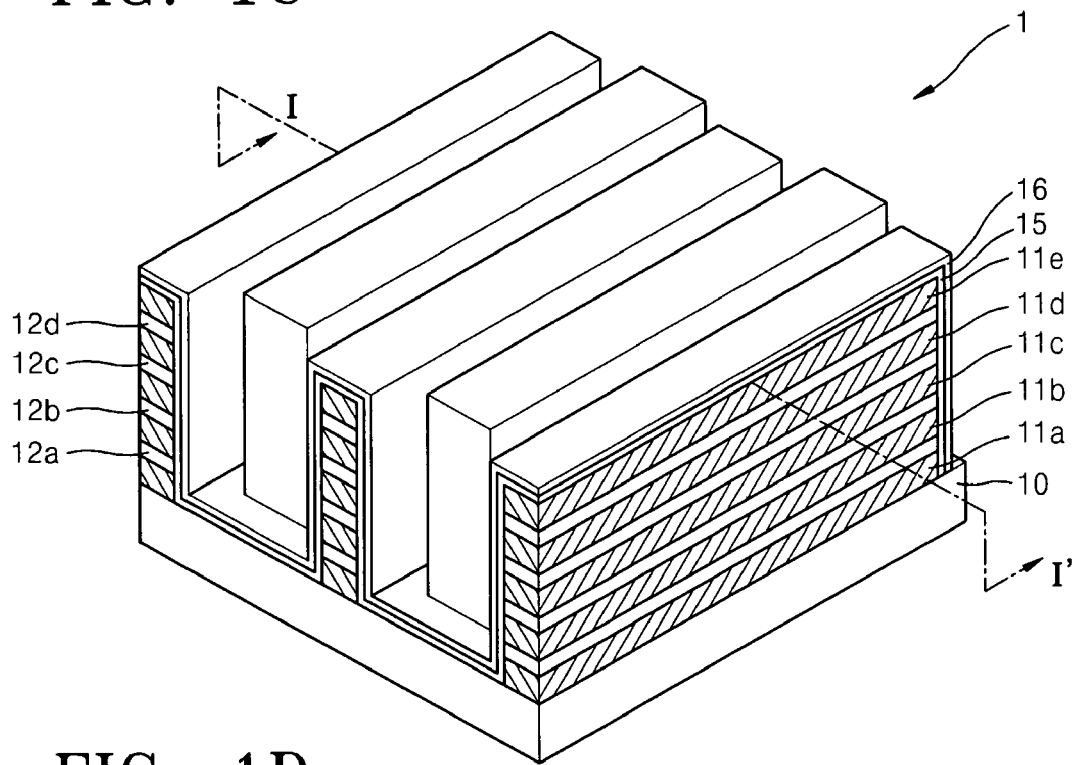
Figure 2C:
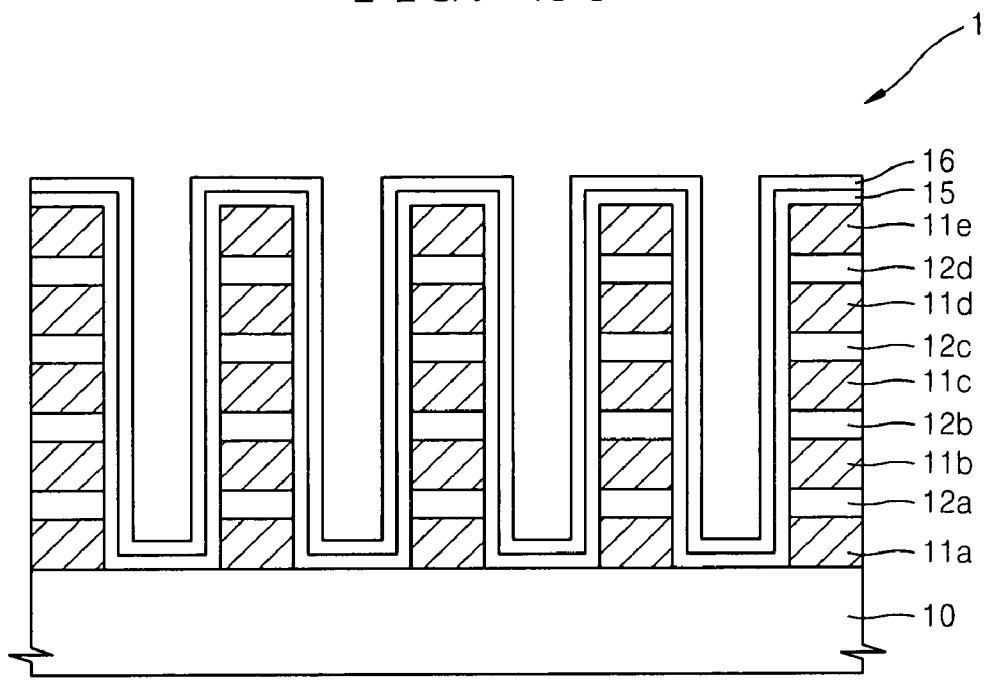

Referring to FIGS. 1C and 2C, a diode layer 15 and a variable resistance body layer 16 may be sequentially formed on the substrate 10 on which the separate stack structures 14a, 14b, 14c, 14d, and 14e are formed. For example, a diode material may be deposited on the substrate 10 on which the separate stack structures 14a, 14b, 14c, 14d, and 14e are formed, thereby forming the diode layer 15. For example, a semiconductor material, e.g., silicon or polysilicon, may be deposited on the substrate 10 on which the separate stack structures 14a, 14b, 14c, 14d, and 14e are formed and an ion implantation process may be performed so as to dope the semiconductor material with a P-type impurity (for example, boron (B)) and an N-type impurity (for example, phosphorus (P) or arsenic (As)). Accordingly, a P-type semiconductor and an N-type semiconductor may be formed. The diode layer 15 may be formed by the connection of the formed P-type semiconductor and the N-type semiconductor.

A variable resistance material may be deposited on the diode layer 15 so as to form the variable resistance body layer 16. For example, a variable resistance material, for example, a perovskite-based oxide or a binary transition metal oxide, may be deposited on the diode layer 15. The perovskite-based oxide may include $Pr_{0.7}Ca_{0.3}MnO_3$, $SrZrO_3/SrTiO_3$, or $Pb(Zr, Ti)O_3/Zn_{0.4}Cd_{0.6}S$ and the binary transition metal oxide may include NiO, TiN, $TiO_2$, $HfO_2$, or $ZrO_2$.

Figure 1D:
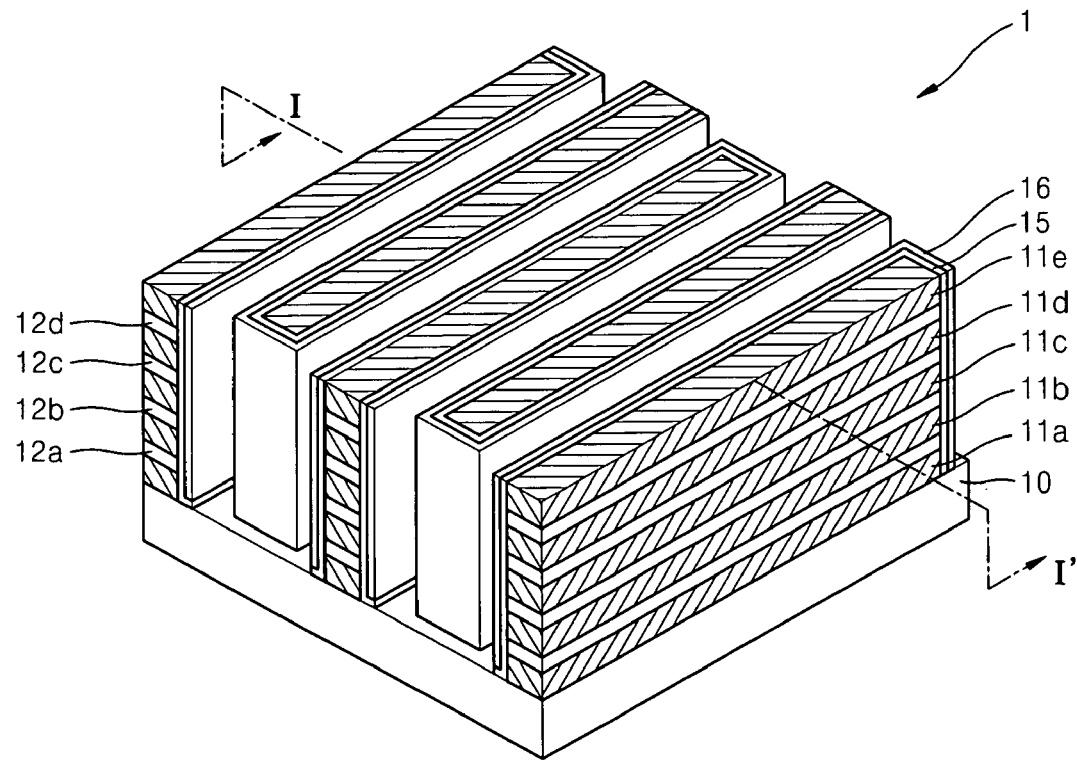
Figure 2D:
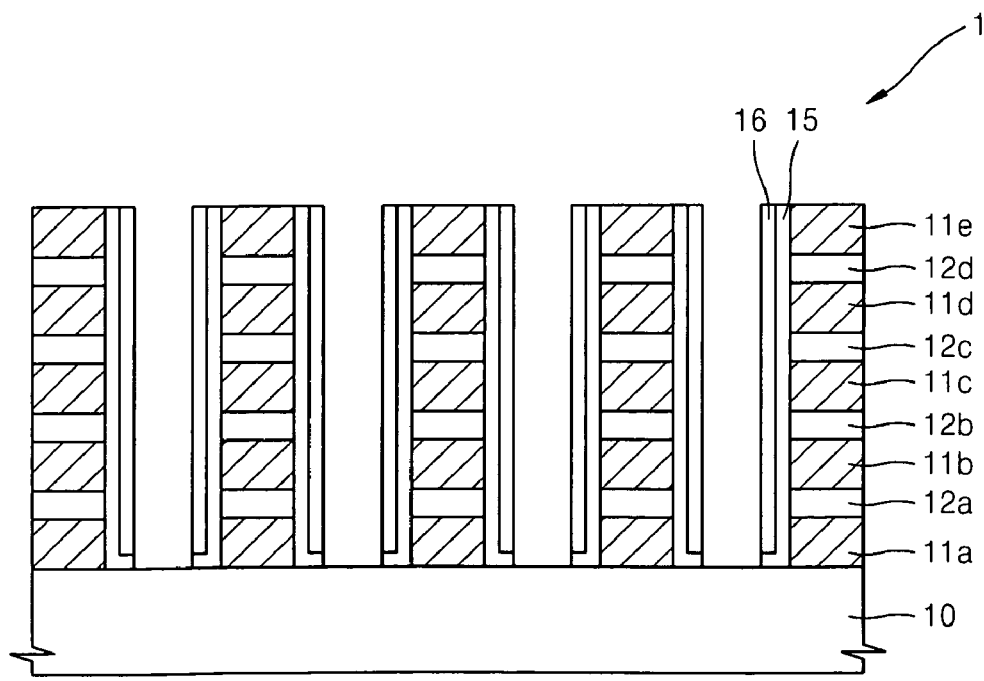

Referring to FIGS. 1D and 2D, the diode layer 15 and the variable resistance body layer 16 may be removed from predetermined or given areas of the substrate 10 on which the diode layer 15 and the variable resistance body layer 16 are formed. The diode layer 15 and the variable resistance body layer 16 may be removed by dry etching or wet etching.

For example, some parts of the diode layer 15 and the variable resistance body layer 16 formed on the plurality of separate stack structures 14a, 14b, 14c, 14d, and 14e may be removed so that the remaining parts of the diode layer 15 and the variable resistance body layer 16 may be included in the plurality of separate stack structures 14a, 14b, 14c, 14d, and 14e, and the insulating layers 11e stacked on the upper most part may be exposed. In addition, some parts of the diode layer 15 and the variable resistance body layer 16 formed on some areas between the plurality of separate stack structures 14a, 14b, 14c, 14d, and 14e may be removed until the substrate 10 is exposed.

Figure 1E:
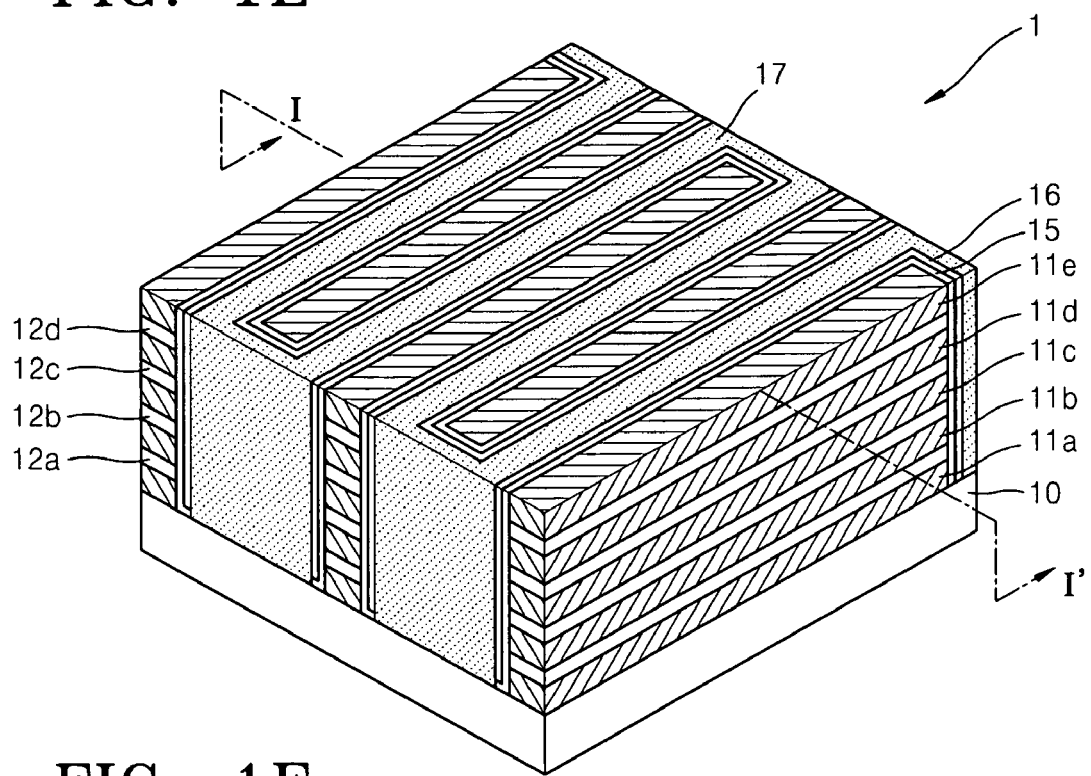

Referring to FIG. 1E, a conductive material may be filled in the area on the substrate 10 where some parts of the diode layer 15 and the variable resistance body layer 16 may be removed. The conductive material may be one selected from the group consisting of polysilicon, a metal, metal silicide, and mixtures thereof, wherein the metal may include at least one selected from the group consisting of cobalt (Co), titanium (Ti), molybdenum (Mo), tantalum (Ta), zirconium (Zr), tungsten (W), and nickel (Ni). The upper part of the resultant in which the conductive material is filled may be planarized using, for example, chemical mechanical polishing (CMP), to form a conductive material layer 17.

Figure 1F:
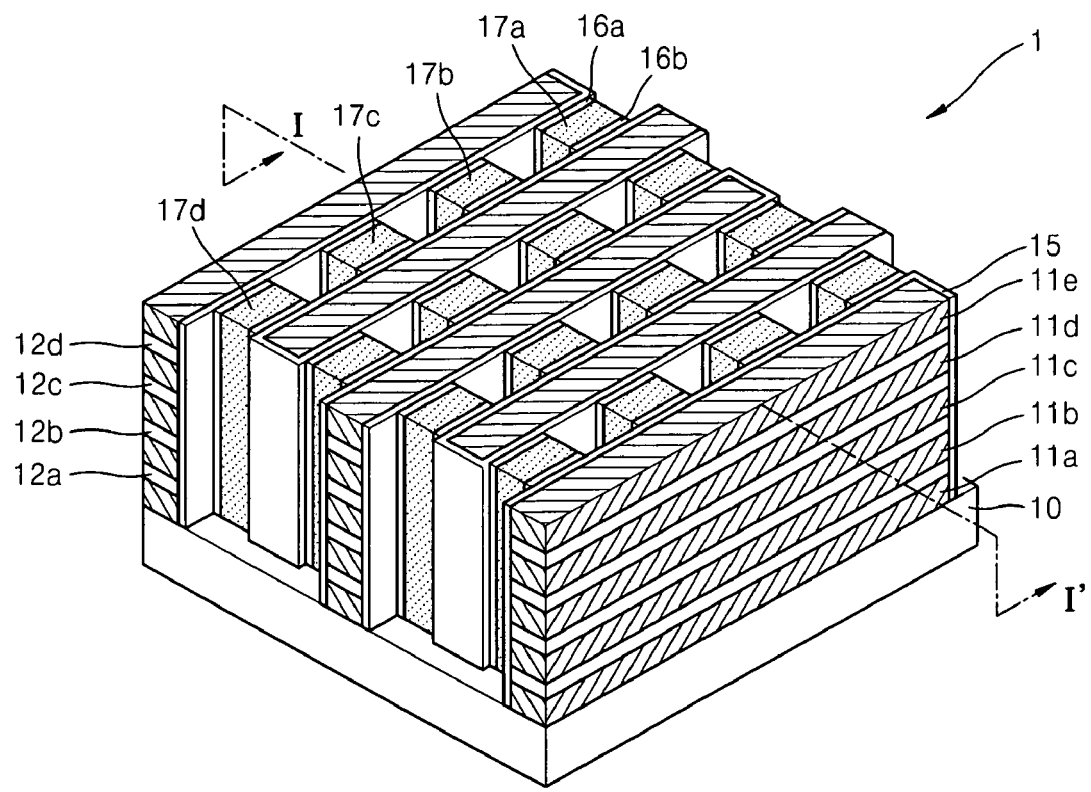
Figure 2E:
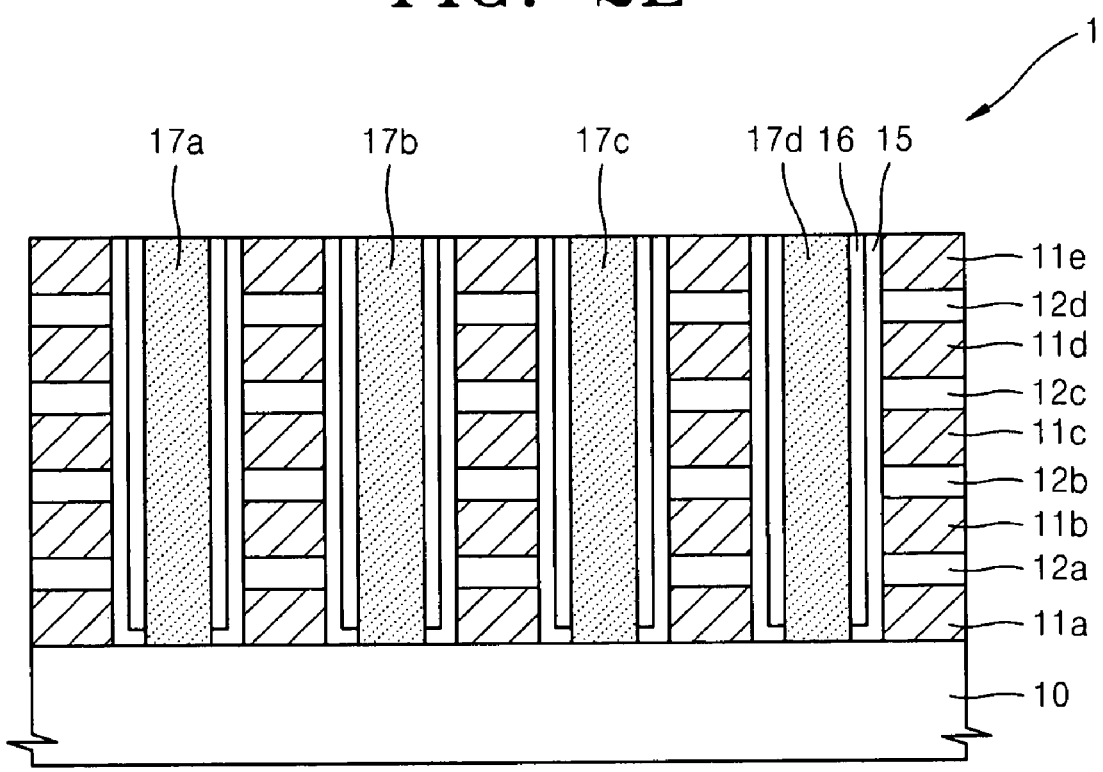

Referring to FIGS. 1F and 2E, predetermined or given areas of the conductive material layer 17 and the variable resistance body layer 16 may be etched from the substrate 10 on which the conductive material layer 17 is formed so as to form a plurality of second electrode layers 17a, 17b, 17c, and 17d and a plurality of variable resistance bodies 16a and 16b at both sides of the plurality of second electrode layers 17a, 17b, 17c, and 17d, respectively.

Accordingly, the non-volatile memory device 1 manufactured as described above may include a plurality of bit lines, a plurality of word lines, a plurality of memory cells, and a plurality of selection elements. The first electrode layers 12a, 12b, 12c, and 12d included in the separate stack structures 14a, 14b, 14c, 14d, and 14e may correspond to the bit lines, and the second electrode layers 17a, 17b, 17c, and 17d may correspond to a plurality of word lines. In addition, the diode layers 15 and the variable resistance bodies 16a interposed between the first electrode layers 12a, 12b, 12c, and 12d, the plurality of insulating layers 11a, 11b, 11c, 11d, and 11e and the second electrode layers 17a, 17b, 17c, and 17d may correspond to memory cells. The first electrode layers 12a, 12b, 12c, and 12d may be insulated by the plurality of insulating layers 11a, 11b, 11c, 11d, and 11e so that the diode layers 15 and the variable resistance bodies 16a may each constitute a plurality of memory cells insulated from each other.

FIGS. 3A through 3D are cross-sectional views schematically illustrating a method of manufacturing a non-volatile memory device 2, according to example embodiments. Hereinafter, the method of manufacturing the non-volatile memory device 2, according to example embodiments, will be described with reference to FIGS. 3A through 3D. The descriptions of the method explained with reference to FIGS. 1A through 1F and FIGS. 2A through 2E also apply to the method of manufacturing the non-volatile memory device 2 illustrated in FIGS. 3A through 3D, and thus, will not be repeated.

Figure 3A:
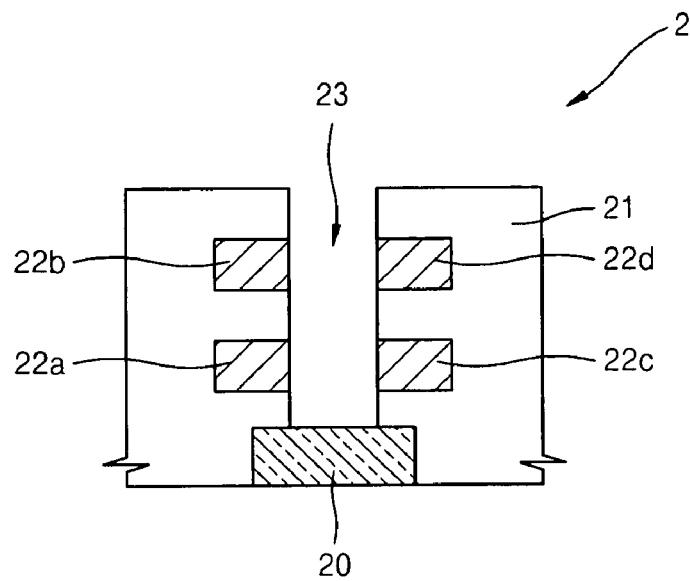
FIGS. 3A through 3D are cross-sectional views schematically illustrating a method of manufacturing a non-volatile memory device, according to example embodiments.

Referring to FIG. 3A, a plurality of selection elements (not illustrated) may be formed on a substrate 20. According to example embodiments, an insulating layer 21 and a plurality of first electrode layers 22a, 22b, 22c, and 22d may be formed on the substrate 20 on which the plurality of selection elements are formed. A predetermined or given area of the insulating layer 21 and the plurality of first electrode layers 22a, 22b, 22c, and 22d may be etched so as to form a first trench 23. For example, interlayer insulating layers and first electrode layers may be alternatively and sequentially deposited on the substrate 20 and a predetermined or given area of the interlayer insulating layers and the first electrode layers may be etched to form the first trench 23. The first trench 23 may be cylinder shaped. Also, the first electrode layers 22a, 22b, 22c, and 22d may correspond to bit lines.

In example embodiments, the insulating layer 21, in which the first trench 23 is formed, may be deposited on the substrate 20 on which the plurality of selection elements are formed. The first electrode layers 22a, 22b, 22c, and 22d may be formed in predetermined or given areas of the insulating layer 21 exposed by the first trench 23. For example, a metal may be coated on the predetermined or given areas of the insulating layer 21 exposed by the first trench 23 and metal silicide may be formed, thereby forming the first electrode layers 22a, 22b, 22c, and 22d.

Figure 3B:
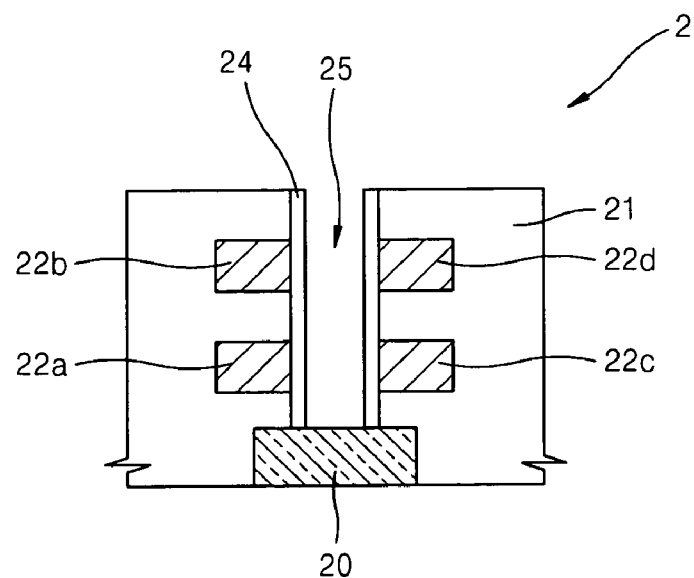

Referring to FIG. 3B, a diode layer 24 may be formed in the first trench 23. For example, the diode layer 24 may be deposited on the substrate 20 and a predetermined or given area of the diode layer 24 may be etched so as to remove the diode layer 24 deposited on the insulating layer 21 and the substrate 20 and expose a portion of the substrate 20, thereby forming a second trench 25.

Figure 3C:
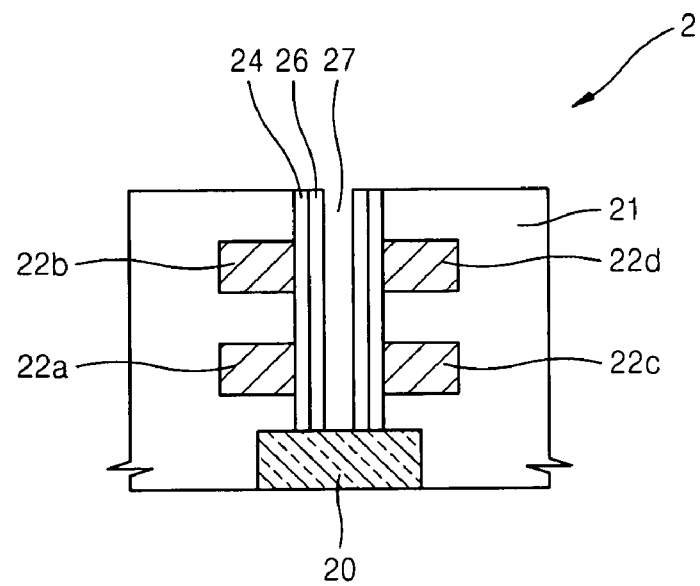

Referring to FIG. 3C, a variable resistance body layer 26 may be formed in the second trench 25. For example, the variable resistance body layer 26 may be formed on the substrate 20 and a predetermined or given area of the variable resistance body layer 26 may be etched so as to remove the variable resistance body layer 26 formed on the insulating layer 21 and the substrate 20 and expose a portion of the substrate 20, thereby forming a third trench 27.

Figure 3D:
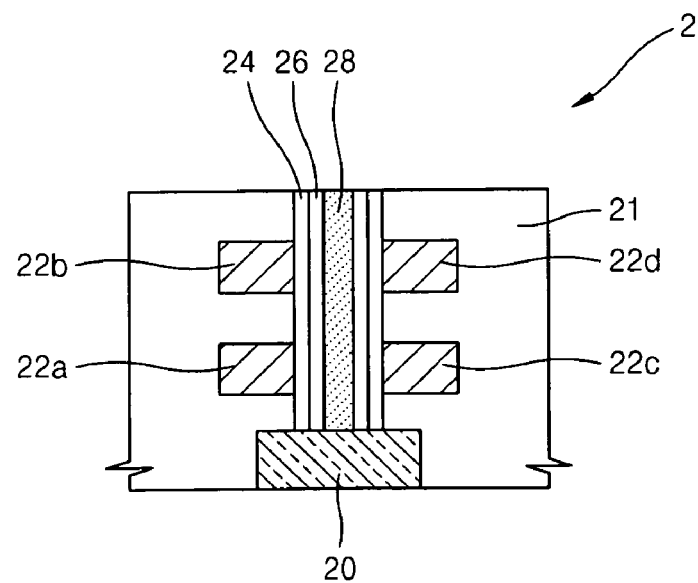

Referring to FIG. 3D, a conductive material may be filled in the third trench 27 so as to form a second electrode layer 28. For example, the conductive material may be deposited in the third trench 27 so as to fill the third trench 27, thereby forming the second electrode layer 28. The upper part of the second electrode layer 28 may be planarized using, for example, CMP. The second electrode layer 28 may correspond to a word line.

Figure 4:
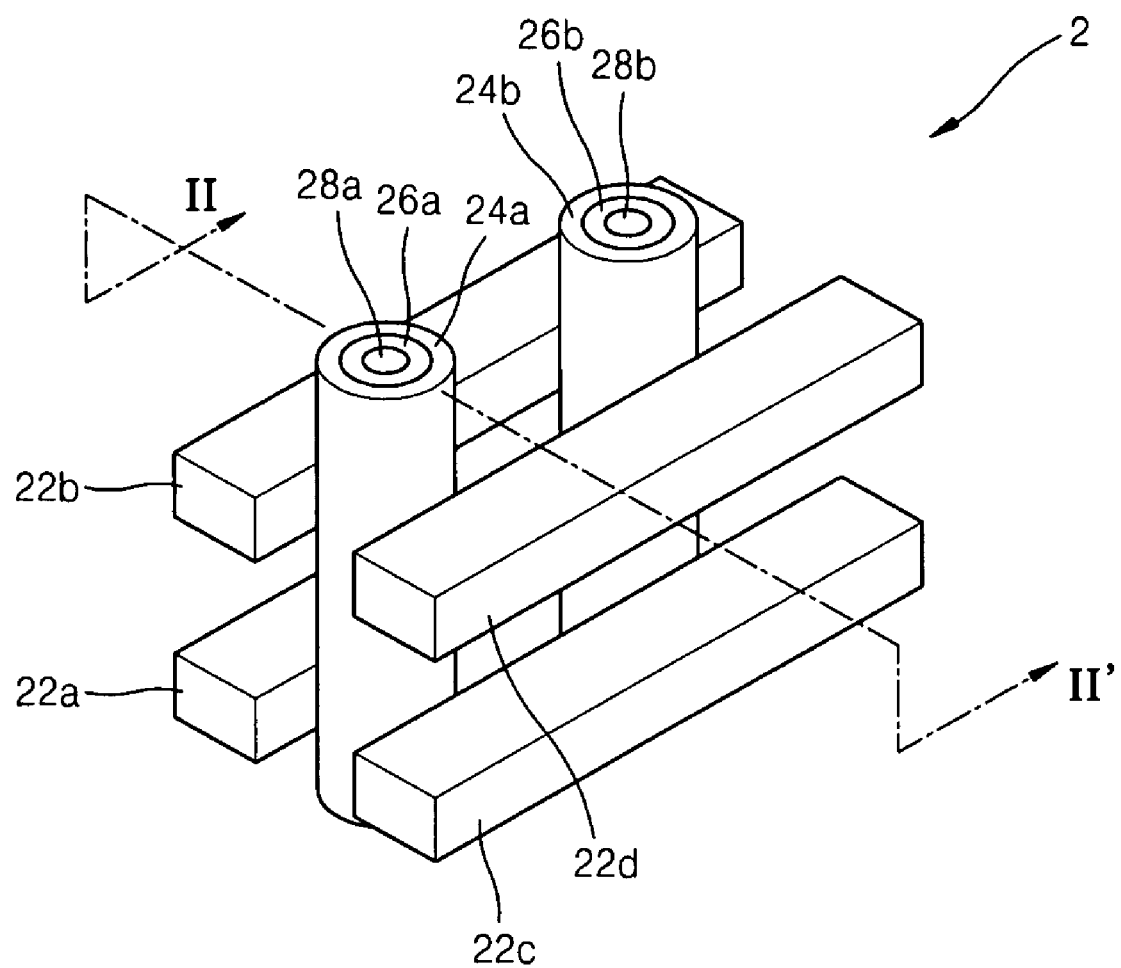
FIG. 4 is a perspective view of the non-volatile memory device manufactured using the method of manufacturing a non-volatile memory device of FIGS. 3A through 3D.

FIG. 4 is a perspective view of the non-volatile memory device 2 manufactured using the method of manufacturing the non-volatile memory device 2 of FIGS. 3A through 3D. Referring to FIG. 4, the non-volatile memory device 2 may include a plurality of bit lines, a plurality of word lines, a plurality of memory cells, and a plurality of selection elements. A plurality of second electrode layers 28a and 28b, which are arranged in a perpendicular direction with respect to the substrate 20 and have a form of a cylinder, may correspond to word lines and the plurality of first electrode layers 22a, 22b, 22c, and 22d which are arranged in a perpendicular direction with respect to the plurality of second electrode layers 28a and 28b may correspond to the bit lines.

Also, variable resistance body layers 26a and 26b and diode layers 24a and 24b, which sequentially surround the plurality of second electrode layers 28a and 28b, respectively, may correspond to memory cells. The plurality of first electrode layers 22a, 22b, 22c, and 22d may be insulated by the insulating layer 21 (not shown) so that the variable resistance body layers 26a and 26b and the diode layers 24a and 24b may each constitute a plurality of memory cells that are insulated from each other.

Figure 5:
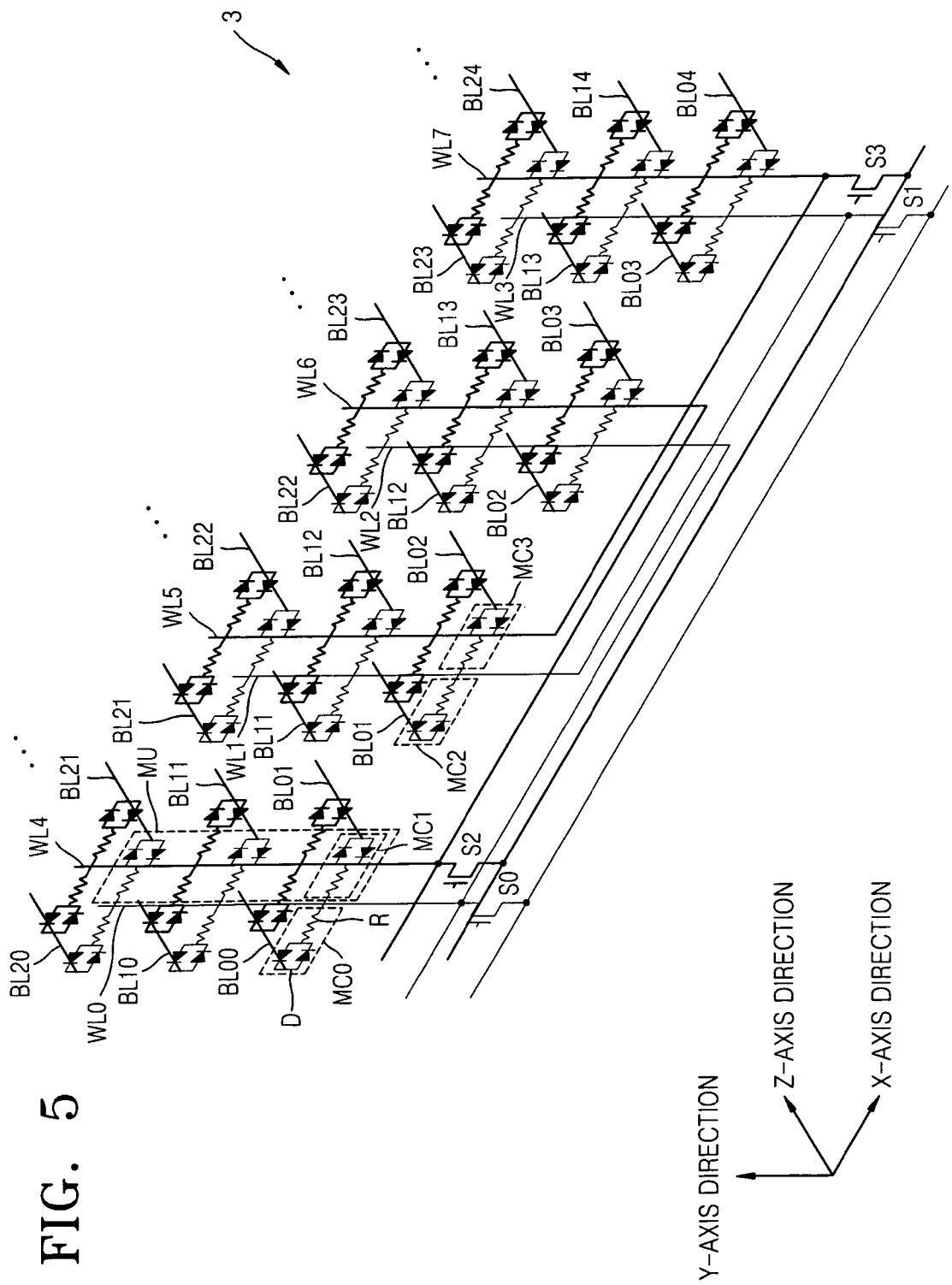
FIG. 5 is a circuit diagram of a non-volatile memory device according to example embodiments.

FIG. 5 is a circuit diagram of a non-volatile memory device 3 according to example embodiments. Referring to FIG. 5, the non-volatile memory device 3 may be manufactured by using the method described in FIGS. 1A through 1F, 2A through 2E, or 3A through 3D and corresponds to the non-volatile memory device 2 of FIG. 4. The non-volatile memory device 3 may include a plurality of first signal lines WL0 through WL7, a plurality of second signal lines BL00 through BL24, a plurality of memory cells MC0, MC1, MC2, and MC3, and a plurality of selection elements S0 through S3. Hereinafter, directions of elements included in the non-volatile memory device 3 may be described based on the right-handed Cartesian axes system; however, example embodiments are not limited thereto.

The plurality of first signal lines WL0 through WL7 may be arranged in the Y-axis direction and may have a matrix structure including a plurality of rows and a plurality of columns. According to example embodiments, the plurality of first signal lines WL0 through WL7 may be word lines. Hereinafter, the plurality of first signal lines WL0 through WL7 may be word lines; however, example embodiments are not limited thereto.

The plurality of second signal lines BL00 through BL24 may be arranged in the Z-axis direction and may have a matrix structure including a plurality of rows and a plurality of columns. According to example embodiments, the plurality of second signal lines BL00 through BL24 may be bit lines. Hereinafter, the plurality of second signal lines BL00 through BL24 may be bit lines; however, example embodiments are not limited thereto.

The plurality of memory cells MC0, MC1, MC2, and MC3 may be each arranged in a line at both sides of the plurality of word lines WL0 through WL7. One of the ends of the plurality of memory cells MC0, MC1, MC2, and MC3 may be connected to one of the plurality of word lines WL0 through WL7 and the other ends of the plurality of memory cells MC0, MC1, MC2, and MC3 may be each connected to one of the plurality of bit lines BL00 through BL24.

A pair of adjacent memory cells MC0 and MC1 may be connected to the single word line WL0 from among the plurality of word lines WL0 through WL7 and thus shares the one word line WL0 from among the plurality of word lines WL0 through WL7. Also, the memory cells MC1 and MC2, which are included in a different pair and are adjacent to each other, may be connected to the single bit line BL01 from among the plurality of bit lines BL00 through BL24, and thus, shares the one bit line BL01 from among the plurality of bit lines BL00 through BL24. The bit lines BL01 connected to the memory cells MC1 and MC2, which are each included in a different pair and are adjacent to each other, may be spaced apart from each other so as to distinguish the memory cell MC1 from the memory cell MC2; however, the bit lines BL01 may be substantially connected to each other, as will be described below with reference to FIGS. 6 and 7.

For example, the plurality of memory cells MC0, MC1, MC2, and MC3 may each include a variable resistor R, and a diode D connected in series to the variable resistor R. A first terminal of the variable resistor R may be connected to one of the plurality of word lines WL0 through WL7 and a second terminal of the variable resistor R may be connected to the diode D. In addition, a first terminal of the diode D may be connected to the second terminal of the variable resistor R and the second terminal of the diode D may be connected to one of the plurality of bit lines BL00 through BL24. The memory cells connected in a line to one of the plurality of word lines WL0 through WL7 may be memory units MU. Hereinafter, the variable resistor R and the diode D are described in more detail.

The variable resistor R may have a reset state, which is a higher resistance state, and a set state, which is a lower resistance state, as a resistance value is changed due to an application of a voltage or a current pulse. That is, the variable resistor R may be transited to a higher resistance state or a lower resistance state due to an application of a voltage or a current pulse and may be used as a memory device for storing information, by using the two states as bit information. For example, a resistance value may be changed according to the size of a voltage or current in a variable resistance body included in a uni-directional resistance memory device, whereas a resistance value is changed according to the size of a voltage or current and a direction in a variable resistance body included in a bi-directional resistance memory device.

The diode D may be realized as a bi-directional diode or a uni-directional diode. A memory cell including the diode D may apply greater write current which exponentially increases according to an applied voltage, compared with a memory cell including a transistor as a memory cell structure so that example embodiments are not limited to a size of a transistor, and the sizes of memory cells and a chip may be reduced.

Accordingly, in example embodiments, resistive RAM, RRAM, or ReRAM including the memory cells including the variable resistance body is described and hereinafter, a non-volatile memory device realized as a resistive memory device is described. However, example embodiments are not limited thereto.

The plurality of selection elements S0 through S3 may be connected to the lower ends of the plurality of word lines WL0 through WL7 and perform selection operations for at least two word lines from among the plurality of word lines WL0 through WL7. For example, the plurality of selection elements S0 through S3 may be realized as selection transistors.

In general, a plurality of transistors may be each connected to a plurality of word lines, and thus, selection operations for each of the word lines connected to the transistors may be performed by on/off operations of each of the transistors. However, the sizes of memory cells may be continuously reduced due to an increase in integration according to the development of semiconductor technology, and thus, a size of a transistor may actually be a factor to decide an entire size of the memory device. Accordingly, although the sizes of memory cells are reduced, the entire area may not be significantly reduced by the sizes of the transistors connected to each word line. Also, as the transistors are connected to each word line, complexity increases.

However, according to example embodiments, at least two word lines may be connected to one selection element, and thus, at least two word lines may share one selection element. For example, the word line WL0 and the word line WL2 may be connected to the selection element S0 and share the selection element S0. That is, selection operations for the word line WL0 and the word line WL2 may be simultaneously performed by an on/off operation of the selection element S0. Accordingly, the number of needed selection elements may be reduced to half at a minimum, and thus, a size of the non-volatile memory device may be significantly reduced. In addition, the number of selection elements which are operated by the non-volatile memory device may be reduced to half at a minimum, and thus, complexity may also be reduced to half at a minimum.

Similarly, the word line WL1 and the word line WL3 may be connected to the selection element S1 and share the selection element S1. Accordingly, selection operations for the word line WL1 and the word line WL3 may be simultaneously performed by an on/off operation of the selection element S1. Also, the word line WL4 and the word line WL5 may be connected to the selection element S2 and share the selection element S2. Accordingly, selection operations for the word line WL4 and the word line WL5 may be simultaneously performed by an on/off operation of the selection element S2. In addition, the word line WL6 and the word line WL7 may be connected to the selection element S3 and share the selection element S3. Accordingly, selection operations for the word line WL6 and the word line WL7 may be simultaneously performed by an on/off operation of the selection element S3.

Figure 6:
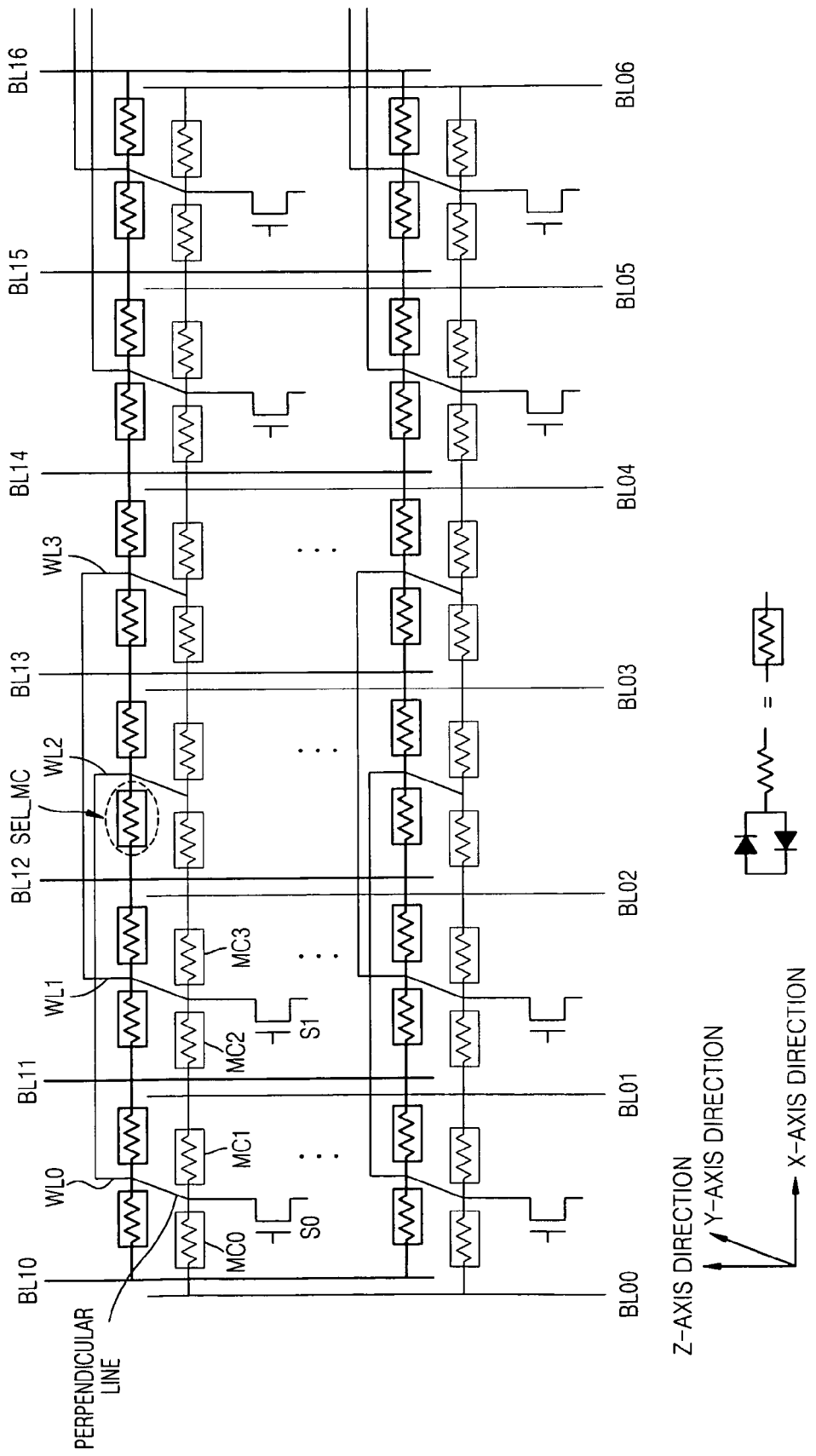
FIG. 6 is a circuit diagram schematically illustrating two layers of the non-volatile memory device of FIG. 5 in a perpendicular direction.

FIG. 6 is a circuit diagram schematically illustrating two layers of the non-volatile memory device 3 of FIG. 5 in a perpendicular direction. Referring to FIG. 6, a pair of memory cells MC0 and MC1 share one word line WL0, which is a perpendicular line, and the memory cells MC1 and MC2, which are each included in a different pair and are adjacent to each other, share the bit line BL01. Two pairs of memory cells may be perpendicularly connected to one word line WL0, which is a perpendicular line. One selection element S0 may be connected to two word lines WL0 and WL2 that are not adjacent to each other, and two adjacent word lines WL2 and WL1 may be connected to the selection elements S0 and S1, respectively.

Hereinafter, a write operation and a read operation for a selection memory cell SEL_MC, which is one of a plurality of memory cells, will be described. When a write operation for the selection memory cell SEL_MC is to be performed, the size of a voltage or current pulse applied to a variable resistance body included in the selection memory cell SEL_MC may be changed. For example, the selection element S0 may be turned on to select the word line WL2 connected to the selection memory cell SEL_MC, and a write voltage, which is a higher voltage, may be applied to the word line WL2. A ground voltage 0V may be applied to the bit line BL 12 connected to the selection memory cell SEL_MC.

The selection element S1 may be turned off and a voltage may not be applied to the word line WL1 and the word line WL3 which are adjacent to the word line WL2. Also, an inhibit voltage may be applied to the bit lines BL11 and BL13, and the bit lines BL01, BL02, and BL03, which are adjacent to the bit line BL12 connected to the selection memory cell SEL_MC in a horizontal direction and a perpendicular direction, respectively. The inhibit voltage may be in the range of the write voltage to 0 V. Accordingly, when a write operation is performed for the selection memory cell SEL_MC, interference occurring due to voltage/current applied to other word lines and bit lines adjacent to the selection memory cell SEL_MC may be reduced.

In addition, when a read operation for the selection memory cell SEL_MC is to be performed, the selection element S0 may be turned on to select the word line WL2 and a read voltage that is less than the write voltage may be applied to the word line WL2. A change of current in the bit line BL12 connected to the selection memory cell SEL_MC may be detected and a read operation may be performed.

Figure 7:
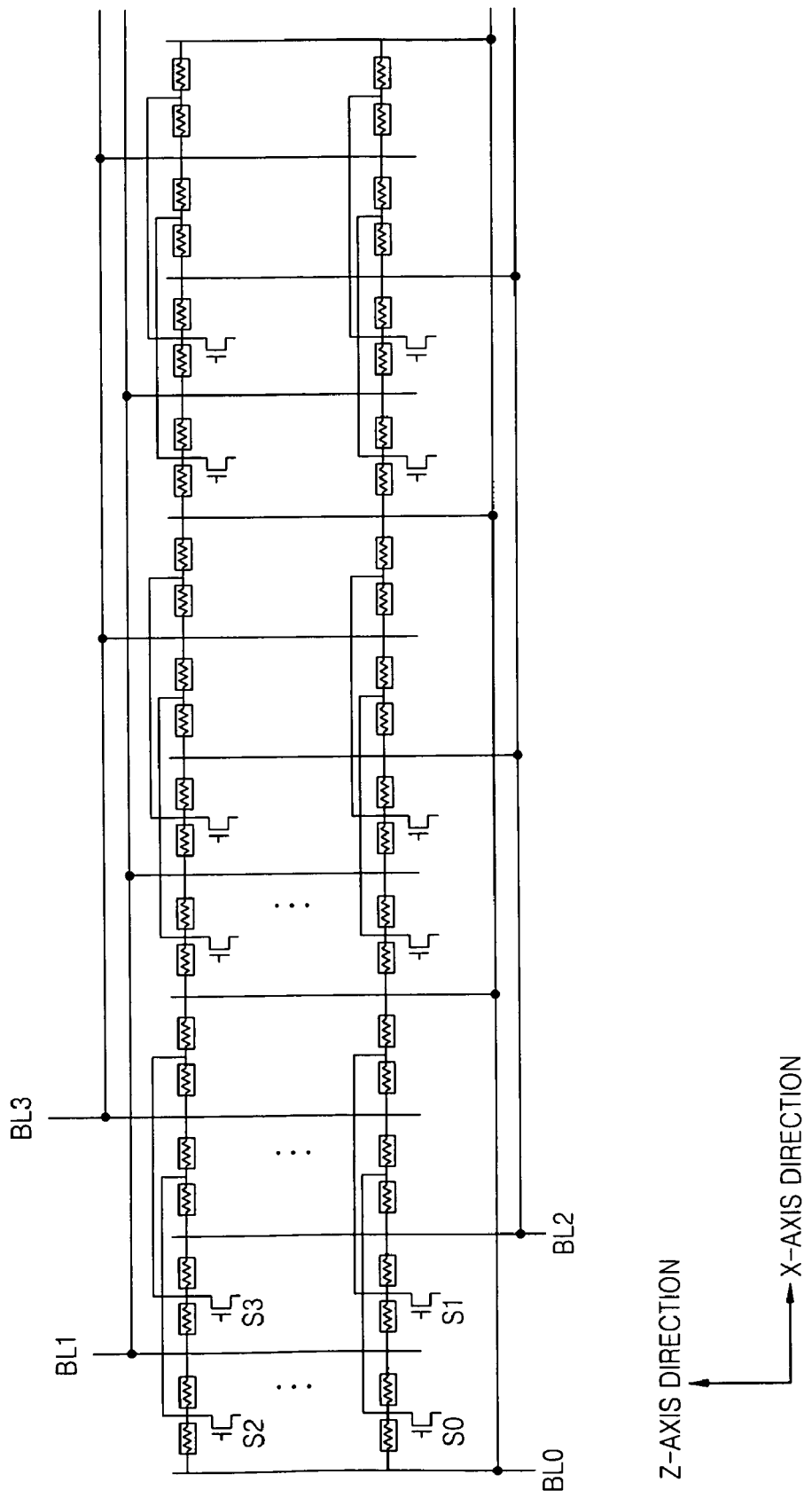
FIG. 7 is a circuit diagram schematically illustrating a layer of the non-volatile memory device of FIG. 5 in a horizontal direction.

FIG. 7 is a circuit diagram schematically illustrating a layer of the non-volatile memory device 3 of FIG. 5 in a horizontal direction. Referring to FIG. 7, the plurality of bit lines included in the non-volatile memory device 3 may be classified into a plurality of groups. For example, the plurality of bit lines included in the non-volatile memory device 3 may be classified into four groups BL0, BL1, BL2, and BL3; however, example embodiments are not limited to classifying the bit lines into four groups, and thus, the bit lines may be classified into two or more groups.

For example, a first layer of the non-volatile memory device 3 may include, for example, 13 bit lines BL00 through BL12. The bit lines BL00, BL04, BL08, BL12 may be classified into the first group BL0, the bit lines BL01, BL05, and BL09 may be classified into the second group BL1, the bit lines BL02, BL06, and BL10 may be classified into the third group BL2, and the bit lines BL03, BL07, and BL11 may be classified into the fourth group BL3.

Because the bit lines BL00 through BL12 are classified into four groups BL0, BL1, BL2, and BL3, address signals for each of the bit lines BL00 through BL12 may not be decoded and address signals for the four groups BL0, BL1, BL2, and BL3 may only be decoded. Thus, a decoder may be simply formed so that an area for realizing the decoder may be significantly reduced and complexity of the decoder may be significantly reduced. Also, because signals in the same level are provided to each group, the operational speed of the non-volatile memory device 3 may be improved. As described above, grouping of the bit lines in the non-volatile memory device 3 is only illustrated. However, example embodiments are not limited thereto and the word lines may also be grouped.

Figure 8:
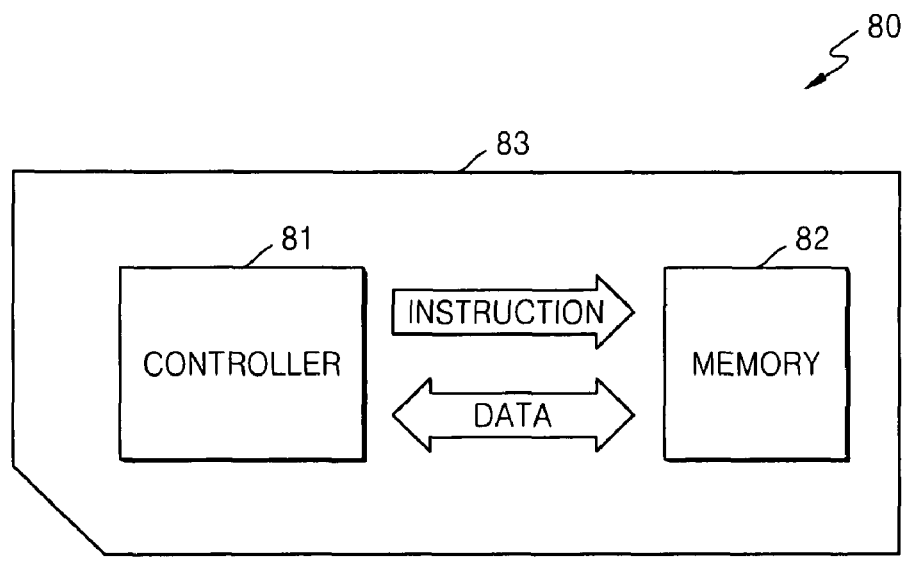
FIG. 8 is a block diagram of a memory card according to example embodiments.

FIG. 8 is a block diagram of a memory card 80 according to example embodiments. Referring to FIG. 8, the memory card 80 may include a controller 81 and a memory unit 82 in a housing 83, wherein electric signals may be exchanged between the controller 81 and the memory unit 82. For example, according to instructions from the controller 81, data may be transmitted between the memory unit 82 and the controller 81. Accordingly, the memory card 80 may store data in the memory unit 82 or output data from the memory unit 82 to an external location.

For example, the memory unit 82 may include the non-volatile memory device 3 of FIGS. 1 through 7. The memory card 80 may be used as a data storage medium in various mobile devices. For example, the memory card 80 may be a multi media card (MMC) or a secure digital (SD) card.

Figure 9:
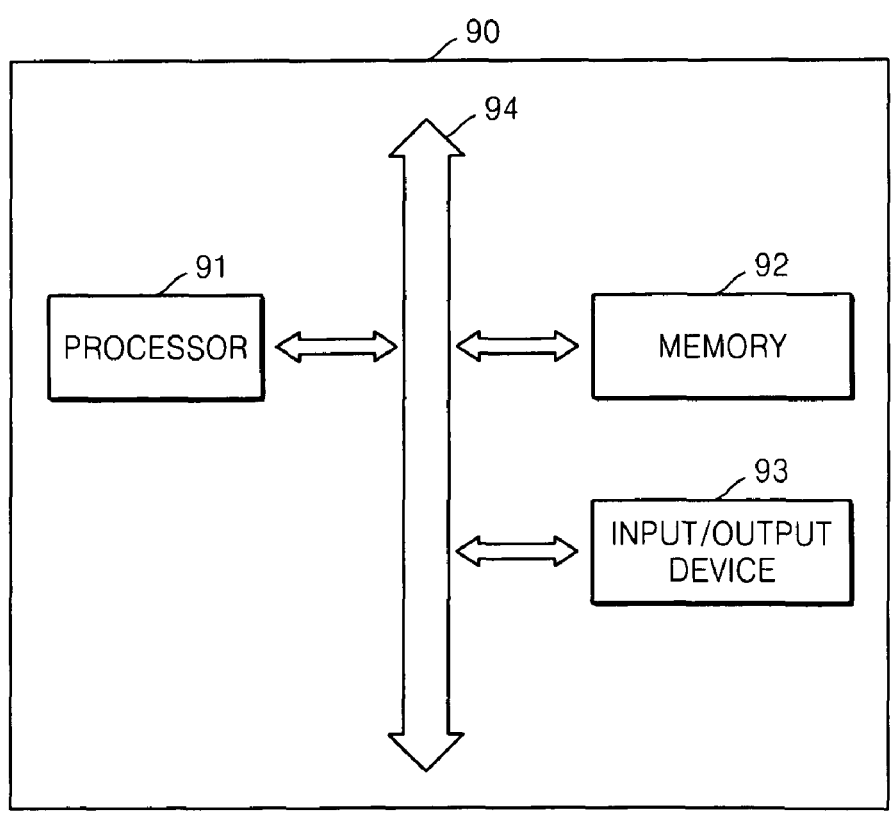
FIG. 9 is a block diagram of an electronic system according to example embodiments.

FIG. 9 is a block diagram of an electronic system 90 according to example embodiments. Referring to FIG. 9, the electronic system 90 may include a processor 91, a memory unit 92, and an input/output device 93, wherein data may be communicated between the processor 91, the memory unit 92, and the input/output device 93 through a bus 94. The processor 91 executes a program and controls the electronic system 90. The input/output device 93 may be used to input or output data to or from the electronic system 90.

The electronic system 90 may be connected to an external device, for example, a PC or a network, using the input/output device 93 and may exchange data with the external device. The memory unit 92 may store a code and data for operating the processor 91. For example, the memory unit 92 may include the non-volatile memory device 3 of FIGS. 1 through 7. The electronic system 90 may form various electronic control devices which need the memory unit 92 and may be used in, for example, mobile phones, MP3 players, navigation devices, solid state drives (SSD), or household appliances.

As described above, according to example embodiments, when memory cells included in a non-volatile memory device include first signal lines that are perpendicular to a substrate, the memory cells share the first signal lines so that the number of selection elements which perform selection operations for the first signal lines may be reduced to half, and thus, an area for realizing the non-volatile memory device may be reduced. Also, the selection elements may be each connected to at least two first signal lines, and thus, a write operation and a read operation may be simultaneously performed for the memory cells connected to the at least two first signal lines selected by one selection element. In addition, the selection elements may be each connected to at least two first signal lines that are not adjacent to each other, and thus, interference of the first signal lines located around the memory cells, which are to perform a write operation or a read operation, may be reduced.

Moreover, second signal lines arranged perpendicular to the first signal lines may be classified into a plurality of groups and the second signal lines included in each group may be connected to each other. Thus, the second signal lines in each group may be driven simultaneously. Accordingly, the operational speed for the second signal lines may be improved and the decoder which decodes address signals of the second signal lines may be simply realized. Thus, the complexity of the decoder may be reduced, and an area for realizing the non-volatile memory device may be reduced.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A non-volatile memory device comprising:
a substrate;
a plurality of first signal lines on the substrate in a vertical direction;
a plurality of memory cells having ends connected to the plurality of first signal lines;
a plurality of second signal lines perpendicular to the plurality of first signal lines on the substrate and each connected to other ends of the plurality of memory cells; and
a plurality of selection elements on the substrate and connected to at least two of the plurality of first signal lines.

2. The non-volatile memory device of claim 1, wherein the plurality of selection elements are each connected to at least two of the plurality of first signal lines that are not adjacent to each other and perform selection operations for the at least two of the plurality of first signal lines.

3. The non-volatile memory device of claim 2, wherein the plurality of second signal lines are classified into a plurality of groups, and the plurality of second signal lines included in each of the plurality of groups are connected to each other.

4. The non-volatile memory device of claim 3, wherein the plurality of second signal lines included in each of the plurality of groups are not adjacent to each other.

5. The non-volatile memory device of claim 2, wherein the plurality of memory cells are arranged in a line and one of the ends of the plurality of memory cells is connected to one of the plurality of first signal lines.

6. The non-volatile memory device of claim 2, wherein a pair of memory cells that are adjacent to each other from among the plurality of memory cells share one of the plurality of first signal lines and the memory cells which are each included in a different pair and are adjacent to each other from among the plurality of memory cells share one of the plurality of second signal lines.

7. The non-volatile memory device of claim 2, wherein the plurality of memory cells each comprise:
 a variable resistance body connected to one of the plurality of first signal lines; and
 a diode between one of the plurality of second signal lines and the variable resistance body.

8. A non-volatile memory device comprising:
 a plurality of memory units including a plurality of memory cells;
 a plurality of first signal lines each formed between a pair of memory units that are adjacent to each other from among the plurality of memory units;
 a plurality of second signal lines each formed between the memory units which are each included in a different pair and are adjacent to each other from among the plurality of memory units; and
 a plurality of selection elements each connected to at least two of the plurality of first signal lines.

9. The non-volatile memory device of claim 8, wherein the plurality of selection elements are each connected to at least two signal lines that are not adjacent to each other from among the plurality of first signal lines and perform selection operations for the at least two connected first signal lines.

10. The non-volatile memory device of claim 9, wherein the plurality of second signal lines are classified into a plurality of groups and the second signal lines included in each of the plurality of groups are connected to each other.

11. The non-volatile memory device of claim 10, wherein the second signal lines included in each of the plurality of groups are not adjacent to each other.

12. The non-volatile memory device of claim 9, wherein the plurality of memory cells each comprise:
 a variable resistance body connected to one of the plurality of first signal lines; and
 a diode between one of the plurality of second signal lines and the variable resistance body.

* * * * *